United States Patent [19]

Hasunuma et al.

[11] Patent Number: 5,247,475
[45] Date of Patent: Sep. 21, 1993

[54] SUPERCONDUCTING MEMORY CIRCUIT AND METHOD OF STORING INFORMATION IN THE SAME BY GENERATING AND TERMINATING A PERSISTENT CURRENT

[75] Inventors: Masahiko Hasunuma, Nishi; Akio Takeoka, Osaka, both of Japan

[73] Assignee: Sanyo Electric Co., Ltd., Osaka, Japan

[21] Appl. No.: 2,115

[22] Filed: Jan. 4, 1993

Related U.S. Application Data

[63] Continuation of Ser. No. 742,181, Aug. 2, 1991, abandoned, which is a continuation of Ser. No. 328,413, Mar. 24, 1989, abandoned.

[30] Foreign Application Priority Data

Mar. 25, 1988 [JP] Japan .................................. 63-72388
Jan. 17, 1989 [JP] Japan .................................. 64-8361

[51] Int. Cl.$^5$ ............................................. G11C 11/44
[52] U.S. Cl. .................................... 365/162; 365/160; 307/306
[58] Field of Search ................. 365/51, 63, 160, 162; 257/31, 34, 35; 307/277, 306, 307

[56] References Cited

U.S. PATENT DOCUMENTS

| | | | |
|---|---|---|---|
| 2,983,889 | 5/1961 | Green | 365/160 |
| 3,043,512 | 7/1962 | Buckingham et al. | 365/160 |
| 4,130,893 | 12/1978 | Henkels | 365/162 |
| 4,601,015 | 7/1986 | Ishida | 365/162 |

*Primary Examiner*—Jack A. Lane
*Attorney, Agent, or Firm*—Darby & Darby

[57] ABSTRACT

A superconducting memory circuit includes a superconducting loop composed of first and second superconducting lines, and bias lines are connected to connection points of the first and second lines. Inductance or critical current values of the first and second lines are different from each other. When a current is supplied to the bias lines, the current is divided and flows in the loop to maintain a magnetic flux thereof at zero. If the current is further increased, a current flowing in one superconducting line reaches the critical current value of itself prior to the other superconducting line, and a larger current flows in the other superconducting line such that a superconducting state is not destroyed. Therefore, a magnetic flux is generated in the loop. If the current of the bias lines is shut-off in this state, a persistent current flows in the loop to maintain the magnetic flux. Thus, "1" can be written. If a current in reverse direction is supplied to the bias lines so as to make the magnetic flux in the loop zero and the current is shut-off in that state, the persistent current does not flow in the loop. Therefore, the magnetic flux disappears, and thus, "0" can be written. The magnetic flux of the loop can be detected by a read line including a Josephson weak-link therein.

5 Claims, 5 Drawing Sheets

F I G. 2
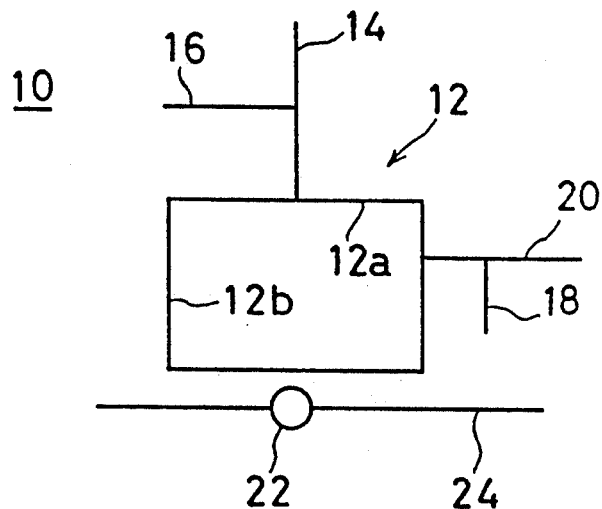

SUPERCONDUCTING MEMORY CIRCUIT AND METHOD OF STORING INFORMATION IN THE SAME BY GENERATING AND TERMINATING A PERSISTENT CURRENT

This is a continuation of application Ser. No. 07/742,181, filed Aug. 2, 1991, now abandoned, which is in turn a continuation of application Ser. No. 07/328,413, filed Mar. 24, 1989, now abandoned.

BACKGROUND OF THE INVENTION

1. Field of the Invention

The present invention relates to a superconducting memory circuit. More specifically, the present invention relates to a superconducting memory circuit utilizing a superconducting loop composed of a superconductor such as an alloy or oxide.

2. Description of the prior art

One example of such a kind of superconducting memory circuit is proposed by P. Wolf et al. in, for example, an article named as "TWO-JUNCTION JOSEPHSON MEMORY" IBM Technical Disclosure Bulletin Vol. 16 No. 1, page 214, June 1973. A basic circuit diagram is shown in FIG. 1. With reference to FIG. 1, a superconducting memory circuit includes a superconducting loop 1 composed of two superconducting lines 1a and 1b both ends of which are connected to each other; bias lines 2 and 3 are supplying a current to the superconducting liens 1a and 1b; a writing gate 4 formed in one superconducting line 1a; signal lines 5 and 6 for applying a magnetic flux to the writing gate 4; and a detection gate 7 and a read line 8 for detecting existence of a magnetic lux generated in the superconducting loop 1. Each of the writing gate 4 and detection gate 7 is constructed by a Josephson junction or Josephson weaklink.

In a case where a binary "1" is to be written in FIG. 1 circuit, a predetermined current is supplied to the signal lines 5 and 6. Responsively, a magnetic flux is given to the writing gate 4, and therefore, the writing gate 4 causes a voltage drop, that is, is changed in a non-superconducting state. Next, a predetermined current is supplied to the bias lines 2 and 3 such that a current flows in the two superconducting lines 1a and 1b. At this time, a current does not flow in superconducting line 1a because the writing gate 4 causes a voltage drop, and a current below a critical current value flows in only the other superconducting line 1b. In this state, if the current of the signal lines 5 and 6 and the current of the bias lines 2 and 3 are both shut off a ring current or persistent current flows in the superconducting loop 1 such that the magnetic flux is continuously generated within the superconducting loop 1, whereby "1" is written.

In the case where a binary "0" is to be written, in the state where no current is supplied to the bias lines 2 and 3, a predetermined current is supplied to the signal lines 5 and 6. Responsively, the writing gate 4 causes a voltage drop, and therefore, the ring current or persistent current does not flow in the superconducting loop 1, and thus, the magnetic flux of the superconducting loop 1 disappears, whereby "0" is written.

In the case where information which is stored in the superconducting loop 1 in the above described manner is to be read, a predetermined current below a critical current value is supplied to the read line 8 and a predetermined current is supplied to the bias lines 2 and 3.

When "1" is stored, since the current from the bias lines 2 and 3 is superposed on the persistent current, the current flows through one of the superconducting lines 1a and 1b becomes larger than the persistent current, and the current flowing in the other superconducting line becomes smaller than the persistent current. Therefore, a magnetic flux larger than that in the case where no current is supplied to the bias lines 2 and 3 is produced. The detection gate 7 causes a voltage drop by this magnet flux, and therefore, the current of the read line 8 becomes smaller. Thus, "1" is read.

When "0" is stored, as described above, no persistent current flows in the superconducting loop 1. At this time, if a predetermined current is supplied to the bias lines 2 and 3, the current is divided in the same amount and flows in the two superconducting lines 1a and 1b, and therefore, no magnetic flux is generated in the superconducting loop 1. Therefore, the detection gate 7 remains in a superconducting state and no change occurs in the current of the read line 8. Thus, "0" is read.

In the conventional superconducting memory circuit as shown in FIG. 1, when "1" is to be written, a predetermined current is supplied once to the signal lines 5 and 6 to cause the writing gate 4 a voltage drop, and a predetermined current is supplied to the bias lines 2 and 3 in this state, and thereafter, the current of the bias lines 2 and 3 and the signal lines 5 and 6 is shut-off. Therefore, operation in the case where "1" is to be written becomes complex, and operation speed is prevented from becoming high.

SUMMARY OF THE INVENTION

A superconducting memory circuit in accordance with the present invention comprises a superconducting loop composed of first and second superconducting lines both ends of which are respectively connected to each other, the electrical characteristics of said first and second superconducting lines being different from each other; first and second bias lines respectively connected to respective connection points of the first and second superconducting lines; and detection means for detecting existence of a magnetic flux in the superconducting loop.

If a current is supplied from the first and second bias lines to the superconducting loop, the current is divided and flows in the first and second superconducting lines so as to maintain the amount of magnetic flux in the superconducting loop at zero. At this time, since electrical characteristics of the first and second superconducting lines are different from each other, if the current amount is increased, the current in one superconducting line reaches a critical current value prior to the current in other superconducting line reaches a larger critical current value. The current preferentially flows in the other superconducting line so as not to destroy a superconducting state of the one superconducting line, and a magnetic flux is generated in the superconducting loop by the current. In this state, if the current from the first and second bias lines to the superconducting loop is shut-off, a ring current or persistent current flows in the superconducting loop so as to maintain the magnetic flux. Thus, "1" is written in the superconducting loop.

In a first embodiment, in order to differentiate the electrical characteristics of the first and second superconducting lines from each other, a value of inductance of the first superconducting line is different from a value of inductance of the second superconducting lines.

A second embodiment, is designed as such that respective critical current values of the first and second superconducting lines are different from each other. A Josephson junction or Josephson weak-link may be formed in the superconducting line having a smaller critical current value.

In accordance with the present invention, a writing operation of "1" into the superconducting loop becomes simple in comparison with a conventional loop. Therefore, a circuit structure also becomes simple ad thus a superconducting memory circuit of a high speed is obtainable.

The objects, features, aspects and advantages of the present invention will become more apparent from the following detailed description of the embodiments of the present invention when taken in conjunction with accompanying drawings.

BRIEF DESCRIPTION OF THE DRAWINGS

FIG. 2 is a circuit diagram showing one embodiment in accordance with the present invention.

DETAILED DESCRIPTION OF THE PREFERRED EMBODIMENTS

Figure 1:
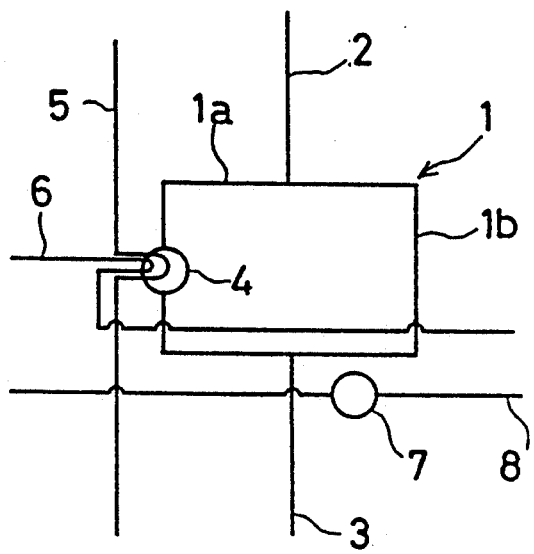
FIG. 1 is a circuit diagram showing one example of a conventional superconducting memory circuit.

With reference to FIG. 2, a superconducting memory cell 10 includes a superconducting loop 12 composed of first and second superconducting lines 12a and 12b both ends of which are respectively connected to each other. The length of the first superconducting line 12a is different from the length of the second superconducting line 12b, whereby an inductance value of the first superconducting line 12a is different from an inductance value of the second superconducting line 12b. In the case of FIG. 2 embodiment, the inductance of the first superconducting line 12a becomes smaller than that of the second superconducting line 12b.

Bias lines 14 and 18 are respectively connected to respective connection points of the first and second superconducting lines 12a and 12b, and a signal line 16 is connected to the bias line 14 and a signal line 20 is connected to the bias line 18.

In addition, a detection gate composed of a Josephson weak-link 22 is formed at a position capable of detecting a magnetic flux generated in the superconducting loop 12, and a read line 24 is connected to the Josephson weak-link 22.

In FIG. 2 circuit, in the case where a binary "1" is to be written, a current equal to a critical current of the superconducting loop 12 is supplied to the bias lines 14 and 18 and the signal lines 16 and 20, respectively. Since the inductance of the first superconducting line 12a is smaller than the inductance of the second superconducting line 12b, a current flowing in the first superconducting line 12a reaches the critical current prior to current in the second superconducting line 12b reaching a larger critical current value. Then, since a current flowing in the second superconducting line 12b increases so as to maintain a superconducting state of the first superconducting line 12a, the values of the current flowing the first and second superconducting lines 12a and 12b become different from each other, and thus, a magnetic flux is generated in the superconducting loop 12. In this state, when the current to the bias lines 14 and 18 and the current to the signal lines 16 and 20 are shut-off, a ring current or persistent current flows in the superconducting loop 12 to maintain the magnetic flux thus generated. Thus, "1" can be written in the superconducting loop 12.

In the case where a binary "0" is to be written, a current is supplied to the bias lines 18 and 14 in opposite direction to the previous case such that the magnetic flux in the superconducting loop 12 is made zero. Thereafter, even if the current to the bias lines 18 and 14 is shut-off, no persistent current can be induced, and therefore, a residual magnetic flux becomes zero. Thus, "0" can be written in the superconducting loop 12.

When the binary "1" or "0" written in the superconducting loop 12 in the above described manner is to be read, a predetermined current is supplied to the read line 24. In "1" state where the magnetic flux is generated in the superconducting loop 12, the Josephson weak-link 22 causes a voltage drop and is changed in a non-superconducting state due to influence of the magnetic flux. Resultingly, a voltage is generated at both ends of the read line 24, and thus, it is possible to detect that the superconducting loop 12 is in a state of "1".

"0" state where no magnetic flux remains in the superconducting loop 12, even if a current is supplied to the read line 24, since the Josephson weak-link 22 is not affected by the influence of the magnetic flux, no voltage is generated at the both ends of the read line 24. Thus, it is possible to detect "0".

Figure 3:
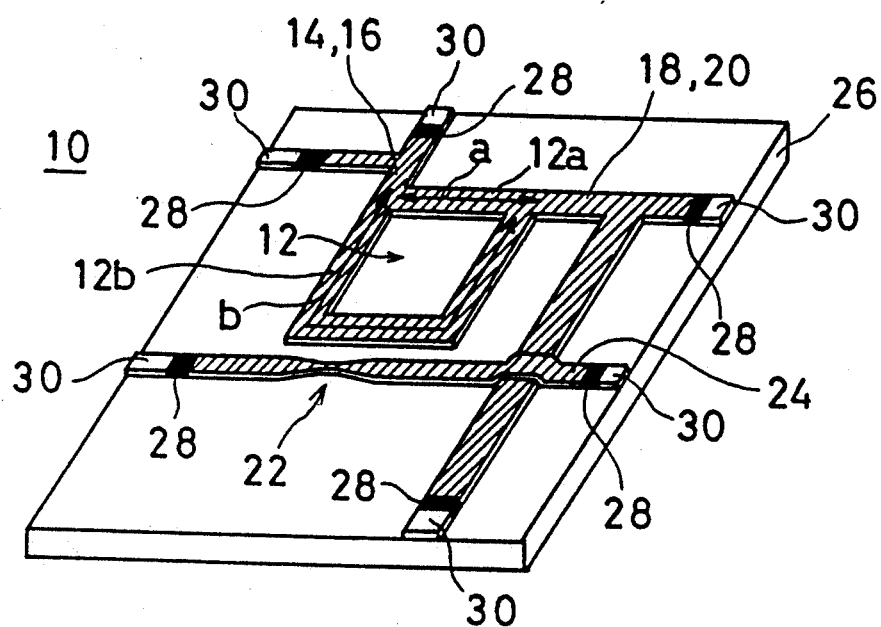
FIG. 3 is a perspective view showing a specific example of FIG. 1 embodiment.
Figure 4:
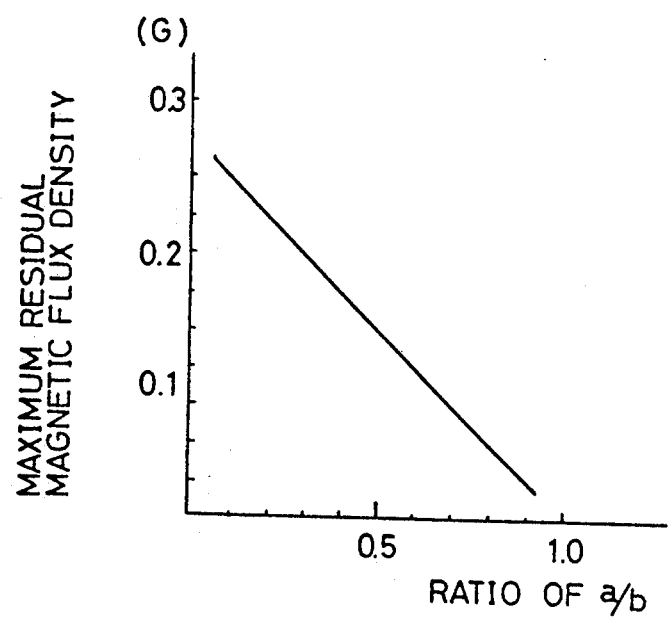
FIG. 4 is a graph showing relationship between length ratio (a/b) of two superconducting lines and a maximum residual magnetic flux density in FIG. 3 embodiment.

With reference to FIG. 3 and FIG. 4, a specific example of FIG. 2 embodiment will be described. In this embodiment shown, a superconductor material of the superconducting loop 12 is Yttrium Barium Copper Oxide ($YBa_2Cu_3O_{7-\delta}$) manufactured by a coprecipitation method. More specifically, after pulverization of powder of this oxide $YBa_2Cu_3O_{7-\delta}$ by using a mortar, the same is mixed with organic binder made of propylene glycol of the same volume. A paste thus obtained is printed on a substrate 26 made of a high purity alumina more than 3N by a screen printing method to form a superconducting circuit including a rectangular superconducting loop 12. In FIG. 3, portions indicated by oblique lines are superconductors.

Next, the substrate 26 on which the paste is printed is fired for 3 hours at 980° C. In FIG. 3, dimensions of respective portions of the superconducting loop 12 are that an outer peripheral is 2 mm×2 mm, an inner peripheral is 1.2 mm×1.2 mm, and a thickness is 50 μm. In addition, the read line 24 includes the Josephson weak-link 22 which is constructed as a superconducting bridge (microbridge). Connecting portions 28 are formed at respective connection ends of the superconducting circuit by vacuum evaporation of copper, and lead wires 30 are connected to the connection portions 28 by means of a ultrasonic soldering. In addition, a junction resistance of each connection portion is 1 $\mu\Omega$. A value of the critical current of the superconducting loop 12 thus constructed is 100 mA. Furthermore, the inductance of the superconducting loop 12 is $1.2 \times 10^{-8}$ H, and the inductance of the first superconducting line 12a having length "a" is $3 \times 10^{-9}$ H and the inductance of the second superconducting line 12b having length "b" is $9 \times 10^{-9}$ H. This means that it is designed as such that the value of the inductance of the second superconducting line 12b becomes three times of the value of the inductance of the first superconducting line 12a. As a result thereof, as seen from FIG. 4, a maximum residual magnetic flux density of the superconducting loop 12 becomes approximately 0.2 G.

As shown in FIG. 3, the bias lines 14 and 18 are arranged to be close to each other as much as possible such that ratio of the inductance of the first and second superconducting lines 12a and 12b can be made small. This is done to make a magnetic flux generated in the superconducting loop 12 and thus the residual magnetic flux after writing be large.

The superconducting memory cell 10 thus manufactured by way of trial is cooled by liquid nitrogen to make the same in a superconducting state.

Next, a current equal to the critical current of 100 mA of the superconducting loop 12 is supplied to the bias lines 14 and 18 and the signal lines 16 and 20. Then, when the current is shut-off and the residual magnetic flux density of the superconducting loop 12 is measured at the Josephson weak-link 22 of the read line 24, the residual magnetic flux density is 0.2 G. In addition, distance between the superconducting loop 12 and the Josephson weak-link 22 is 1.0 mm.

In this state, if a current of 100 mA is supplied to the read line 24, a terminal voltage of the Josephson weak-link 22 becomes 0.01 mV, and thus the read line 24 causes a voltage drop. Thus, "1" is read.

A current of 132 mA is supplied to the bias lines 18 and 14 in a direction opposite to a direction in writing "1", and thereafter, the current is shut-off. At this time, the residual magnetic flux at the Josephson weak-link 22 is 0 G. Therefore, even if a current of 100 mA is supplied to the read line 24, a terminal voltage of the Josephson weak-link 22 is 0 V. Thus, "0" is read.

Figure 5:
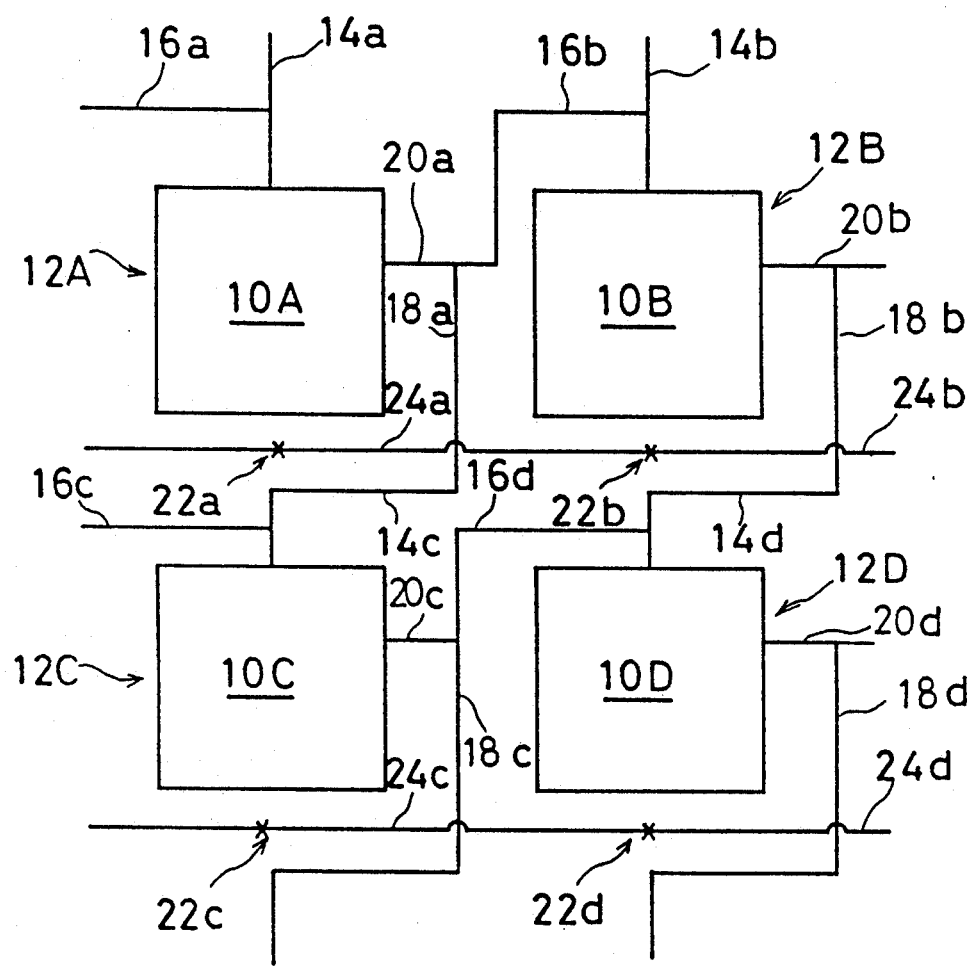
FIG. 5 is a circuit diagram showing a 4-bit superconducting memory which is constructed based upon FIG. 1 (or FIG. 3) embodiment.

FIG. 5 is a circuit diagram showing a 4-bit memory utilizing the superconducting memory cell 10 as shown in FIG. 2 or FIG. 3. A superconducting memory includes four superconducting memory cells 10A, 10B, 10C and 10D each of which is constructed in the same manner as one shown in FIG. 2 or FIG. 3. Therefore, the same or similar reference characters are used in FIG. 5 for indicating the same or similar components in FIG. 2 or FIG. 3, and thus, the detail description thereof will be omitted here.

A bias line 14a of the cell 10A is connected to the superconducting loop of the cell 10A, and a bias line 14b of the cell 10B is connected to the superconducting loop of the cell 10B. A bias line 18a of the cell 10A is connected to a bias line 14c of the cell 10C, and a signal line 20a is connected to a 20 signal line 16b of the cell 10B. Likewise, a bias line 18b of the cell 10B is connected to a bias line 14d of the cell 10D, and a signal line 16d of the cell 10D is connected to a signal line 20c of the cell 10C. Then, read lines 24a and 24b of the cells 10A and 10B are connected in series, and signal lines 24c and 24d of the cells 10C and 10D are connected in series. Each of Josephson weak-links 22a-22d included in each of the respective read lines 24a-24d detects a magnetic flux generated in corresponding one of the superconducting loop of the cells 10A-10D.

In FIG. 5 embodiment, when "1" is to be written in the cell 10A, a critical current Jc is supplied to the bias lines 14a and 18a and the signal lines 16a and 20a so as to generate a magnetic flux in the superconducting loop of the cell 10A. Therefore, a current of 2Jc flows in the superconducting loop of the cell 10A, and a current of Jc flows in the superconducting loops of the cells 10B and 10C which are connected to the superconducting loop of the cell 10A. Then, when the current from the bias lines 14a and 18a and the signal lines 16a and 20a is shut-off, a persistent current flows in only the superconducting loop of the cell 10A to maintain the magnetic flux. Thus, "1" is written in the cell 10A.

In the case where "1" written in the above described manner is to be changed to "0", a current is supplied to the bias lines 14a and 18a in a reverse direction so as to make the magnetic flux in the superconducting loop zero, and thereafter, the current is shut-off. Responsively, the persistent current flowing in the superconducting loop of the cell 10A decreases and the residual magnetic flux thereof becomes zero. Thus, "0" is written in the cell 10A.

When information stored in the cell 10A is to be read, a predetermined current is supplied to the read line 24a. If the superconducting loop of the cell 10A stores "1", since the Josephson weak-link 22a causes a voltage drop, a voltage is generated in the read line 24a. If "0" is stored in the superconducting loop of the cell 10A, the Josephson weak-link 22a remains in a superconducting state, and therefore, no voltage is generated at both ends of the read line 24a.

Thus, "1" or "0" can be written and read in and from the cell 10A. In the same manner, it is possible to write and read a binary "1" or "0" in and from the other cells 10B-10D.

In addition, in FIG. 5 embodiment, the bias lines 14a-14d and 18a-18d are function as column address lines of the memory, and the signal lines 16a-16d and 20a-20d functions as now address lines of the memory.

In FIG. 5 embodiment, four cells are arranged in two columns by two lines to construct a 4-bit memory. In the same way of thinking, by forming a matrix array of $M \times N$, it is possible to construct a $M \times N$ -bit memory.

Figure 6:
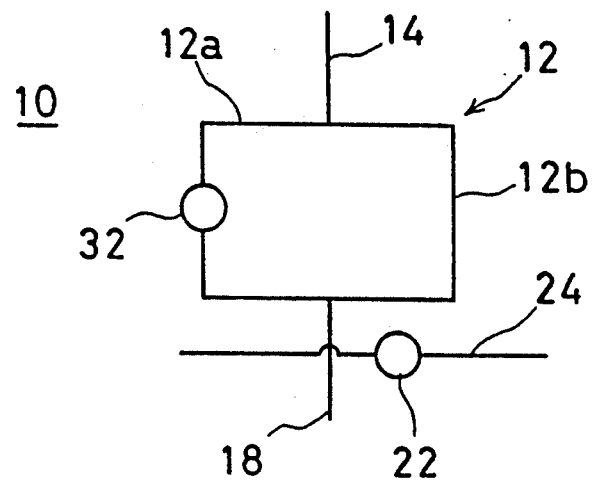
FIG. 6 is a circuit diagram showing another embodiment in accordance with the present invention.

With reference to FIG. 6, another embodiment in accordance with the present invention will be described. In this embodiment, likewise the previous embodiments, a superconducting memory cell 10 includes a superconducting loop 12. The superconducting loop 12 includes two superconducting lines 12a and 12b. More specifically, both ends of the two superconducting lines 12a and 12b are respectively connected to each other to construct the superconducting loop 12. In the embodiment shown, critical current values of the first and second superconducting lines 12a and 12b which constructs the superconducting loop 12 are different from each other. In the embodiment, it is designed or determined as such that a critical current I1 of the first superconducting line 12a is smaller than a critical current I2 of the second superconducting line 12b. Such two superconducting lines critical current values of which are thus different from each other can be obtained from superconductors having different composition, or superconductors having the same composition but different section area.

In the embodiment, a Josephson weak-link 32 is formed in the first superconducting line 12a. Since the Josephson weak-link 32 can be changed from a superconducting state to a non-superconducting state at a critical current smaller than the critical current of the first superconducting line 12a, the first superconducting line 12a as a whole can be changed to a non-superconducting state at a smaller critical current.

In addition, so long as the critical current I1 of the first superconducting line 12a is smaller than the critical current I2 of the second superconducting line 12b, by forming the Josephson weak-link 32 in the first superconducting line 12a the critical current of which is the same as the critical current of the second superconducting line 12b, a whole critical current of the first superconducting line 12a can be smaller than the critical current of the second superconducting line 12b.

Figure 7:
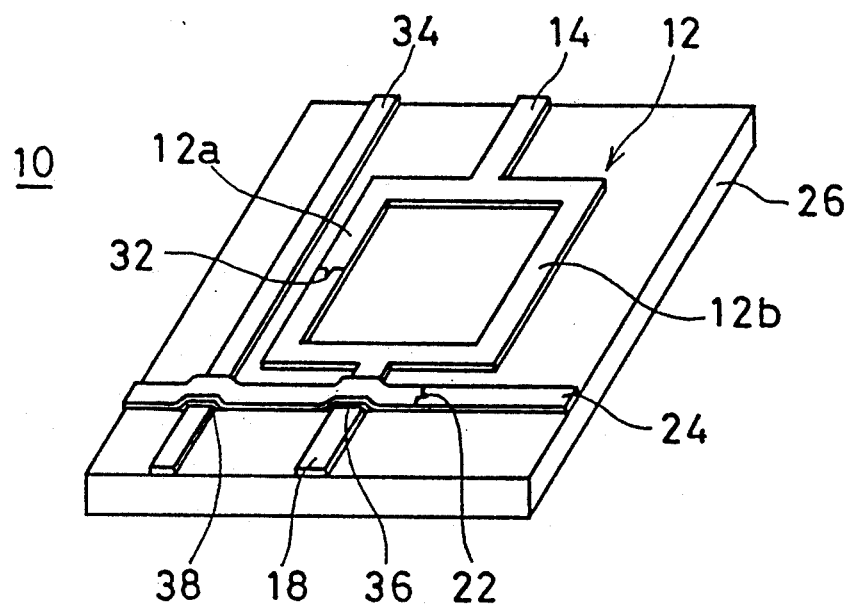
FIG. 7 is a perspective view showing a specific example of FIG. 6 embodiment.

FIG. 7 is a perspective view showing a specific example of FIG. 6 embodiment. In FIG. 7 embodiment, MgO is used as a substrate 26. However, alumina of the previous embodiment, SrTiO₃, YSZ (yttria stabilized zirconia), a semiconductor substrate such as a Si wafer on a surface of which fluoride film is formed, and the like can be used as the substrate 26. A first and second superconducting lines 12a and 12b which construct a superconducting loop 12, bias lines 14 and 18, a Josephson weak-link 32 and a control line 34 are simultaneously formed on the substrate 26 by vacuum evaporation of Nb. In addition, insulation films 36 and 38 made of a tape of polyimide, for example are formed on the bias line 18 and the control line 34, and a read line 24 and a Josephson weak-link 22 are formed by the same Nb vacuum evaporation so as to bridge the bias line 18 and the control line 34. In addition, each of the Josephson weak-links 32 and 22 is constructed as a Josephson weak-link of a tunnel type in which a thin SiO insulation film is inserted.

Size of the superconducting loop 12 is 10 $\mu$m × 10 $\mu$m, width of each line is 2 $\mu$m, and thickness of each lines is 0.1 $\mu$m. Width of each of the bias lines 14 and 18, read line 24 and control line 34 is 2 $\mu$m, and thickness thereof is 0.1 $\mu$m. In addition, a critical current of the first superconducting line 12a is 0.1 mA and a critical current of the second superconducting line 12b is 20 mA. Furthermore, the inductance values of the first and second superconducting lines 12a and 12b are the same $1 \times 10^{-11}$ H; however the inductance values may be different from each other. The control line 34 is formed for the purpose of comparison.

Figure 8:
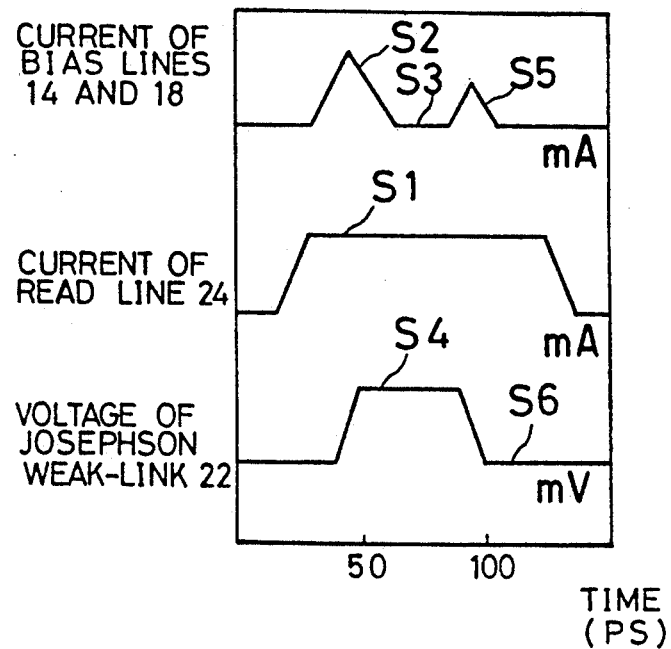
FIG. 8 is a characteristic chart showing operational characteristic of this embodiment.

With reference to FIG. 8, operation of the embodiment as shown in FIG. 6 and FIG. 7 will be described. In a state S1 where a current of 10 $\mu$A is supplied to the read line 24, a current of 0.5 mA is temporarily supplied to the bias lines 14 and 18 (S2). At this time, a current of the first superconducting line 12a reaches the critical current prior to the second superconducting line 12b, and the remaining current flows in the second superconducting line 12b. Since the current flowing in the superconducting lines 12a and 12b are different from each other, a magnetic flux is generated in the superconducting loop 12, and therefore, in a state where no current is supplied to the bias lines 14 and 18, a persistent current flows in the superconducting loop 12 such that the magnetic flux can be maintained. Thus, "1" is written in the superconducting loop 12. Since a voltage at the Josephson weak-link 22 becomes 10 $\mu$V as shown in a state S4, it is possible to determine that "1" was written.

Next, a current of 0.2 mA is temporarily supplied to the bias lines 14 and 18 (S5). At this time, since a current flows in one of the superconducting lines 12a and 12b in a direction that the persistent current is canceled, the magnetic flux in the superconducting loop 12 disappears. Thus, "0" is written in the superconducting loop 12. Since the voltage of the Josephson weak-link 22 becomes 0 $\mu$V as shown in a state S6, it is possible to determine that "0" was written. Time required for the above described operation was $15 \times 10^{-12}$ seconds.

Figure 9:
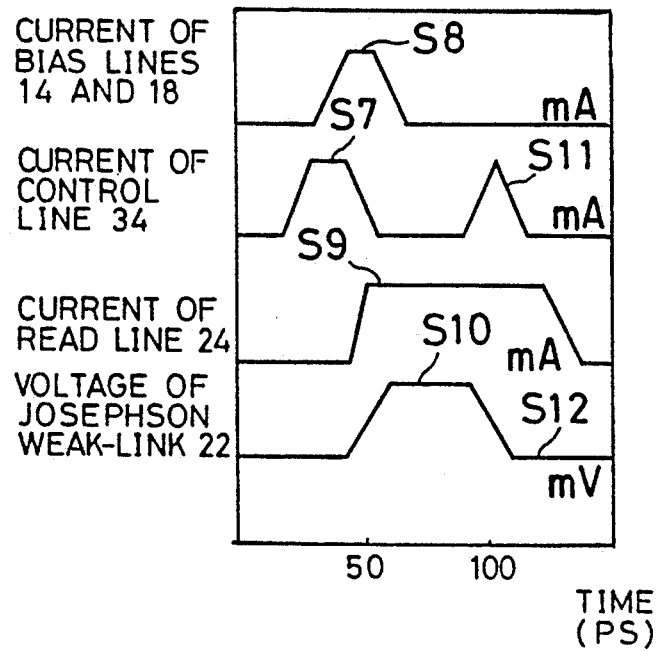
FIG. 9 is a characteristic chart showing operational characteristic of a comparative example.

In addition, the control line 34 is formed for comparison purpose, and operation for writing and reading "1" or "0" by flowing and shutting-off a current in the control line 34 will be described with reference to FIG. 9.

By temporarily supplying a current of 10 mA to the control line 34 (S7), the Josephson weak-link 32 is made in a non-superconducting state. In this state, a current of 0.3 mA is supplied to the bias lines 14 and 18 as shown in a state S8, and thereafter, the current of the control line 34 and the bias lines 14 and 18 is shut-off. In this state, since the current of the first and second superconducting lines 12a and 12b are different from each other, a magnetic flux is generated in the superconducting loop 12, and thus, "1" is written. Now, if a current of 10 mA is supplied to the read line 34 (S9), the voltage at the Josephson weak-link 22 becomes 10 V due to the magnetic flux in the superconducting loop 12 (S10). Thus it is possible to determine that the magnetic flux exists in the superconducting loop 12, that is, "1" was written.

Next, as shown in a state S11, a current of 10 mA is supplied to the control line 34. Responsively, the Josephson weak-link 32 becomes a non-superconducting state and thus the persistent current in the superconducting loop 12 disappears and the magnetic flux in the superconducting loop 12 disappears. Then, if the current of the control line 34 is shut-off, the voltage of the Josephson weak-link 22 becomes 0 $\mu$V (S12). Thus, it is possible to determine that "0" was stored in the superconducting loop 12. Time required for the above described operation was $30 \times 10^{-12}$ seconds.

In addition, when writing operation of "1" and "0" is repeated once in the above described embodiment and ten times the comparative example, erroneous operation occurs. In the comparative example which is operated in the same operational principle as in the conventional one, reduction of reliability takes place by a punch through phenomenon that is characteristic of transition operation in the Josephson weak-link 32. In addition, the punch though phenomenon means a phenomenon where in resetting the Josephson weak-link which is in a non-superconducting state by the magnetic flux due to the current of the control line in an initial zero voltage state, because of rapid sweeping speed of the current of the control line, the Josephson weak-link causes a voltage drop with a finite voltage and cannot become zero voltage.

In addition, oxide is used as a superconductor in FIG. 2 and FIG. 3 embodiments, but alloy is used in FIG. 6 and FIG. 7 embodiments. However, material of the superconductor is not limited to the material used in the embodiments, a superconductor made of arbitrary material can be used in the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A superconducting memory circuit, comprising:
   a superconducting loop having first and second superconductivity lines electrically connected to each other at connection points, said first superconductivity line having an electric characteristic value associated with a first critical current and said second superconductivity line having an electric characteristic value associated with a second critical current so that said first superconductivity line reaches the first critical current faster than said second superconductivity line reaches the second critical current;
   a first signal line and a first bias line both connected to one of the connection points of said first superconductivity line and said second superconductivity line;
   a second signal line and a second bias line both connected to the other one of the connection points of said first superconductivity line and said second superconductivity line;
   means for changing a state of the superconducting loop to store information in the superconducting loop, said changing means including
   first means for generating a magnetic flux by temporarily supplying a first current to said superconducting loop through each of said first signal line, said first bias line, said second signal line and said second bias line in a first direction so as to establish a persistent current in said superconducting loop, the persistent current generating the magnetic flux whereby the existence of the magnetic flux is indicative of a first state of the superconducting loop, and
   second means for stopping generation of the magnetic flux by temporarily supplying a second current smaller than said first current to said superconducting loop through one of a pair of said first and second signal lines and a pair of said first and second bias lines, the second means temporarily supplying the second current in a second direction different from said first direction so as to terminate the persistent current in the superconducting loop and thereby cease generation of the magnetic flux, an absence of the magnetic flux being indicative of a second state of the superconducting loop which differs from that of the first state;
   detection means spaced from said superconducting loop for detecting an existence of said magnetic flux in said superconducting loop and for detecting an absence of said magnetic flux in said superconducting loop, whereby detection of the existence of said magnetic flux signifies the first state of the superconducting loop and detection of the absence of said magnetic flux signifies the second state of the superconducting loop and,
   a plurality of memory cells each having a respective superconducting loop with respective first signal and bias line and respective second signal and bias lines, a plurality of said respective first and second signal lines being connected such that said memory cells can be connected in series to each other in a row direction, and a plurality of said respective first and second bias lines being connected such that said memory cells can be connected in series to each other in a column direction.

2. A superconducting memory circuit in accordance with claim 1, wherein one of said first and second superconductivity lines having a smaller critical current includes a Josephson weak-link.

3. A superconducting memory circuit in accordance with claim 2, wherein elements in association with critical current of said first and second superconductivity lines are different from each other.

4. A superconducting memory circuit in accordance with claim 2, wherein length of said first and second superconducting lines are different from each other.

5. A method of storing information in a superconducting memory circuit, comprising the steps of:
   changing a state of a superconducting loop to store information, the superconducting loop having first and second superconductivity lines electrically connected to each other at connection points, said first superconductivity line having an electric characteristic value associated with a first critical current and said second superconductivity line having an electric characteristic value associated with a second critical current so that said first superconductivity line reaches the first critical current faster than said second superconductivity line reaches the second critical current, the step of changing including the steps of
   generating a magnetic flux by temporarily supplying a first current to said superconducting loop through each of a first signal line, a first bias line, a second signal line, and a second bias line in a first direction so as to establish a persistent current in said superconducting loop, the persistent current generating the magnetic flux whereby the existence of the magnetic flux is indicative of a first state of the superconducting loop, said first signal line and said first bias line both being connected to one of the connection points of said first superconductivity line and said second superconductivity line, said second signal line and said second bias line both being connected to the other one of the connection points of said first superconductivity line and second superconductivity line so that a plurality of memory cells each have a respective superconducting loop with respective first signal and bias lines and respective second signal and bias lines, a plurality of said respective first and second signal lines being connected such that said memory cells can be connected in series to each other in a row direction, and a plurality of said respective first and second bias lines being connected such that said memory cells can be connected in series to each other in a column direction, and
   stopping generation of the magnetic flux by temporarily supplying a second current smaller that said first current to said superconducting loop through one of a pair of said first and second signal lines and a pair of said first and second bias lines, the second current being temporarily supplied in a second direction different from said first direction so as to terminate the persistent current in the superconducting loop and thereby cease generation of the magnetic flux, an absence of the magnetic flux being indicative of a second state of the superconducting loop which differs from that of the first state; and
   detecting an existence of said magnetic flux in said superconducting loop and detecting an absence of said magnetic flux in said superconducting loop, whereby detection of the existence of said magnetic flux signifies the first state of the superconducting loop and detection of the absence of said magnetic flux signifies the second state of the superconducting loop.

* * * * *